(12) United States Patent
Chow et al.

(10) Patent No.: US 8,143,711 B2
(45) Date of Patent: Mar. 27, 2012

(54) INTEGRATED CIRCUIT PACKAGE SYSTEM WITH OFFSET STACKING AND ANTI-FLASH STRUCTURE

(75) Inventors: Seng Guan Chow, Singapore (SG); Heap Hoe Kuan, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/831,822

(22) Filed: Jul. 7, 2010

(65) Prior Publication Data

US 2010/0270680 A1 Oct. 28, 2010

Related U.S. Application Data

(62) Division of application No. 11/954,613, filed on Dec. 12, 2007, now Pat. No. 7,781,261.

(51) Int. Cl.
*H01L 23/28* (2006.01)

(52) U.S. Cl. ........ 257/686; 257/724; 257/777; 257/784; 257/E23.066

(58) Field of Classification Search .................... 438/617
See application file for complete search history.

(56) References Cited

U.S. PATENT DOCUMENTS

| | | | |
|---|---|---|---|
| 5,333,505 A | 8/1994 | Takahashi et al. |
| 5,373,189 A | 12/1994 | Massit et al. |
| 5,950,070 A | 9/1999 | Razon et al. |
| 6,043,109 A | 3/2000 | Yang et al. |
| 6,239,496 B1 | 5/2001 | Asada |
| 6,252,308 B1 | 6/2001 | Akram et al. |
| 6,268,654 B1 | 7/2001 | Glenn et al. |
| 6,291,884 B1 | 9/2001 | Glenn et al. |
| 6,340,846 B1 | 1/2002 | LoBianco et al. |
| 6,401,545 B1 | 6/2002 | Monk et al. |
| 6,492,726 B1 | 12/2002 | Quek et al. |
| 6,653,723 B2 | 11/2003 | Manansala |
| 6,727,579 B1 | 4/2004 | Eldridge et al. |
| 6,730,543 B2 | 5/2004 | Akram |
| 6,962,282 B2 | 11/2005 | Manansala |
| 6,995,448 B2 | 2/2006 | Lee et al. |
| 7,026,709 B2 | 4/2006 | Tsai et al. |
| 7,026,710 B2 | 4/2006 | Coyle et al. |
| 7,031,500 B1 | 4/2006 | Shinohara |
| 7,138,706 B2 | 11/2006 | Arai et al. |
| 7,187,067 B2 | 3/2007 | Weng et al. |
| 7,227,253 B2 | 6/2007 | Tsai et al. |
| 7,245,008 B2 | 7/2007 | Lee |
| 7,288,835 B2 | 10/2007 | Yim et al. |
| 7,298,033 B2 | 11/2007 | Yoo |
| 7,309,913 B2 | 12/2007 | Shim et al. |
| 7,391,105 B2 | 6/2008 | Yeom |
| 7,468,556 B2 | 12/2008 | Logan et al. |
| 7,504,284 B2 | 3/2009 | Ye et al. |
| 7,521,790 B2 | 4/2009 | Tanida et al. |
| 7,535,086 B2 | 5/2009 | Merilo et al. |
| 7,557,443 B2 | 7/2009 | Ye et al. |
| 7,589,408 B2 | 9/2009 | Weng et al. |
| 7,683,469 B2 | 3/2010 | Oh et al. |
| 2002/0030261 A1 | 3/2002 | Rolda, Jr. et al. |
| 2004/0106229 A1 | 6/2004 | Jiang et al. |

(Continued)

*Primary Examiner* — Stephen W Smoot
(74) *Attorney, Agent, or Firm* — Mikio Ishimaru

(57) ABSTRACT

An integrated circuit package system includes: a carrier; a device structure in an offset location over the carrier with the device structure having a bond pad and a contact pad; an electrical interconnect between the bond pad and the carrier; an anti-flash structure over the device structure with the anti-flash structure exposing the contact pad; and a package encapsulation adjacent to the anti-flash structure and over the carrier.

10 Claims, 6 Drawing Sheets

U.S. PATENT DOCUMENTS

| | | |
|---|---|---|
| 2004/0145039 A1 | 7/2004 | Shim et al. |
| 2005/0253241 A1 | 11/2005 | Hall |
| 2006/0014328 A1 | 1/2006 | Shimonaka et al. |
| 2006/0046332 A1 | 3/2006 | Derderian et al. |
| 2006/0076690 A1 | 4/2006 | Khandros et al. |
| 2006/0220256 A1 | 10/2006 | Shim et al. |
| 2006/0244157 A1 | 11/2006 | Carson |
| 2006/0256525 A1 | 11/2006 | Shim et al. |
| 2007/0108581 A1 | 5/2007 | Shim et al. |
| 2007/0181990 A1 | 8/2007 | Huang et al. |
| 2007/0190690 A1 | 8/2007 | Chow et al. |
| 2007/0216010 A1 | 9/2007 | Yim et al. |
| 2007/0246815 A1 | 10/2007 | Lu et al. |
| 2007/0278696 A1 | 12/2007 | Lu et al. |
| 2008/0157325 A1 | 7/2008 | Chow et al. |
| 2009/0085178 A1 | 4/2009 | Ha et al. |
| 2009/0152692 A1 | 6/2009 | Chow et al. |
| 2009/0152700 A1 | 6/2009 | Kuan et al. |
| 2009/0152706 A1 | 6/2009 | Kuan et al. |

INTEGRATED CIRCUIT PACKAGE SYSTEM WITH OFFSET STACKING AND ANTI-FLASH STRUCTURE

CROSS-REFERENCE TO RELATED APPLICATION(S)

This is a divisional of U.S. patent application Ser. No. 11/954,613 filed Dec. 12, 2007 now U.S. Pat. No. 7,781,261.

TECHNICAL FIELD

The present invention relates generally to an integrated circuit package system and more particularly to an integrated circuit package system with an encapsulation.

BACKGROUND ART

In order to interface an integrated circuit with other circuitry, it is common to mount it on a lead frame or substrate. Each integrated circuit has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". Particularly acute, the needs for portable personal electronics, such as cell phones, digital cameras, music players, personal digital assistants (PDA's), and location-based devices, have further driven the need for increased integrated circuit density.

This increased integrated circuit density has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a printed circuit board (PCB) substrate onto which a set of separate integrated circuit components are directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover, the substrate and integrated circuit are often damaged during assembly or testing, complicating the manufacturing process and increasing costs.

For both vertical and horizontal multi-chip packages, assembly of the multi-chip packages must have reliable electrical and mechanical attachments between the multiple integrated circuits, the stacked packaged integrated circuits, or a combination thereof. For example, the encapsulating process for forming the packaged integrated circuit may cause contamination, such as mold flash or bleed, impeding reliable attachments. Another example, for integrated circuit packages having a recess in the encapsulation, contoured mold chase are used to form the recess which increases the risk of mold flashes, damage to the package structure from contact with the contoured portion of the mold chase, and the manufacturing cost to design specific mold chase for the desired recess in the encapsulation.

Thus, a need still remains for an integrated circuit package system providing low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing of an integrated circuit package system including: mounting a device structure in an offset location over a carrier with the device structure having a bond pad and a contact pad; connecting an electrical interconnect between bond pad and the carrier; forming an anti-flash structure over the device structure with the anti-flash structure exposing the contact pad; and forming a package encapsulation adjacent to the anti-flash structure and over the carrier.

The present invention provides an integrated circuit package system including: a carrier; a device structure in an offset location over the carrier with the device structure having a bond pad and a contact pad; an electrical interconnect between the bond pad and the carrier; an anti-flash structure over the device structure with the anti-flash structure exposing the contact pad; and a package encapsulation adjacent to the anti-flash structure and over the carrier.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
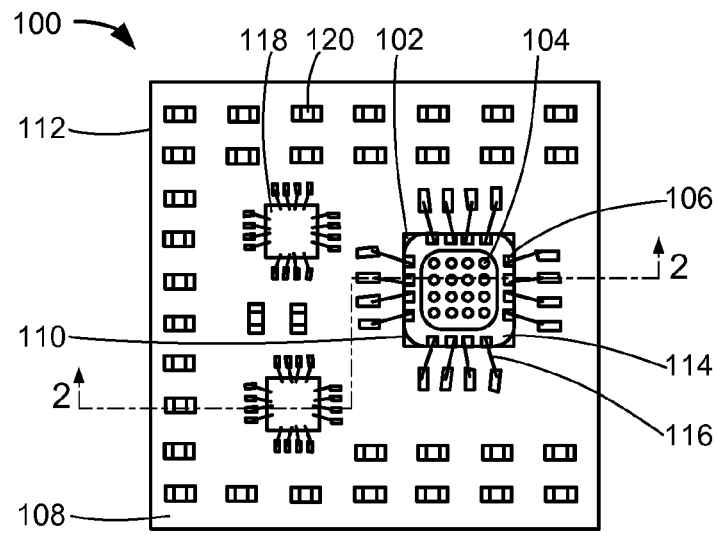
FIG. 1 is a top plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top plan view depicts the integrated circuit package system 100 without a cover. The top plan view depicts a device structure 102, such as substrate, having contact pads 104 and bond pads 106 over a carrier 108, such as a substrate. Sides 110 of the device structure 102 are shown parallel to edges 112 of the carrier 108. The device structure 102 is shown in an offset location over the carrier 108 and not in a central location over the carrier 108.

The contact pads 104 are shown within a ring of an anti-flash structure 114, such as non-conductive epoxy, sealant, polymeric material, wire lock resin material, or penetrable film adhesive, over a peripheral region of the device structure 102. Electrical interconnects 116, such as bond wires or ribbon bond wires, may connect between the bond pads 106 and the carrier 108. The anti-flash structure 114 conformally covers, contacts, and encloses the ends of the electrical interconnects 116 connected at the device structure 102.

First integrated circuit devices 118, such as integrated circuit dice or packaged integrated circuit, and passive devices 120, such as discrete resistors or capacitors, mount over the carrier 108. For illustrative purposes, the first integrated circuit devices 118 are shown as the same type of devices, although it is understood that the first integrated circuit devices 118 may be different from each other, such as different types, functions, size, or technologies. Also for illustrative purposes, the passive devices 120 are shown as the same type of components, although it is understood that the passive devices 120 may be different from each other. For example, the passive devices 120 may include different resistors, capacitors, inductors, or a combination thereof.

Figure 2:
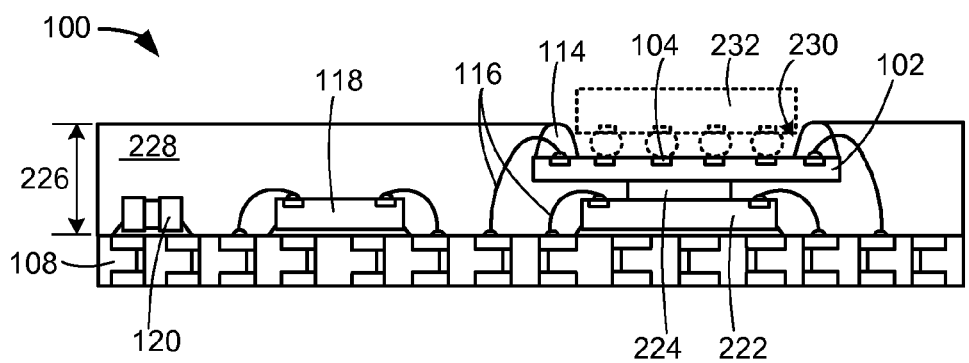
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts a second integrated circuit device 222, such as an integrated circuit die, mounted over the carrier 108. A spacer 224, such as a film adhesive, may provide clearance for the electrical interconnects 116 to connect between the second integrated circuit device 222 and the carrier 108.

The device structure 102 mounts over the second integrated circuit device 222 and the carrier 108. The device structure 102 is shown in an offset location over the carrier 108 and not in a central location over the carrier 108. The anti-flash structure 114 over the peripheral region of the device structure 102, the device structure 102, the spacer 224, and the second integrated circuit device 222 may determine an encapsulation height 226 of a package encapsulation 228 over the carrier 108.

The package encapsulation 228 is over the carrier 108 covering the first integrated circuit devices 118, the passive devices 120, the second integrated circuit device 222, the electrical interconnects 116, and the spacer 224. The package encapsulation 228 may be adjacent to the anti-flash structure 114 forming a recess 230 which exposes the contact pads 104 of the device structure 102.

The anti-flash structure 114 may serve a number of functions. For example, the anti-flash structure 114 mitigate or eliminate wire sweep of the electrical interconnects 116 connected with the device structure 102 thereby improving yield and lowering cost. As another example, the anti-flash structure 114 may mitigate or eliminate mold flashing over the contact pads 104 thereby improving reliability, improving yield, and lowering cost.

A mounting device 232, such as an integrated circuit or a passive component, may optionally mount over the integrated circuit package system 100 forming an integrated circuit package-on-package system. The mounting device 232 is depicted with dotted lines. The mounting device 232 may mount over the device structure 102 and within the recess 230.

It is understood that the first integrated circuit devices 118, the second integrated circuit device 222, and the mounting device 232 shown in the embodiments are for illustrative purposes. The first integrated circuit devices 118, the second integrated circuit device 222, and the mounting device 232 may be a wafer level chip scale package (WLCSP), redistributed line (RDL) die, array package, leadless package, leaded package, system-in-package (SiP), stacked die package, package-in-package (PiP), embedded die substrate, or thermally enhanced package, EMI shielded package.

Figure 3:
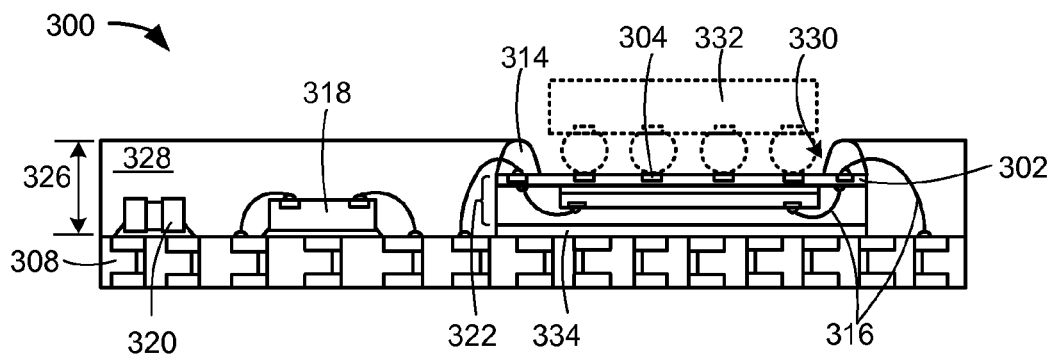
FIG. 3 is a cross-sectional view of an integrated circuit package system exemplified by the top view of FIG. 1 in a second embodiment of the present invention.

Referring now to FIG. 3, therein is shown a cross-sectional view of an integrated circuit package system 300 exemplified by the top view of FIG. 1 in a second embodiment of the present invention. The cross-sectional view depicts passive devices 320 and first integrated circuit devices 318, such as integrated circuit dice, mounted over a carrier 308. A second integrated circuit device 322, such as a packaged integrated circuit, mounts over the carrier 308 with an adhesive 334 and may be adjacent to one of the first integrated circuit devices 318.

The second integrated circuit device 322 includes a device structure 302 as its substrate. The second integrated circuit device 322 is shown in an offset location over the carrier 308 and not in a central location over the carrier 308. Electrical interconnects 316 may connect the device structure 302 and the carrier 308. As an example, the second integrated circuit device 322 is shown in an inverted configuration with the device structure 302 facing away from the carrier 308.

An anti-flash structure 314 is over the peripheral region of the device structure 302 and a portion of the electrical interconnects 316 over the device structure 302. The anti-flash structure 314 and the second integrated circuit device 322 may determine an encapsulation height 326 of a package encapsulation 328 over the carrier 308.

The package encapsulation 328 is over the carrier 308 covering the first integrated circuit devices 318, the passive devices 320, the second integrated circuit device 322, and the electrical interconnects 316. The package encapsulation 328 may be adjacent to the anti-flash structure 314 forming a recess 330 which exposes contact pads 304 of the device structure 302.

A mounting device 332, such as an integrated circuit or a passive component, may optionally mount over the integrated circuit package system 300 forming an integrated circuit package-on-package system. The mounting device 332 is depicted with dotted lines. The mounting device 332 may mount over the device structure 302 and within the recess 330.

Figure 4:
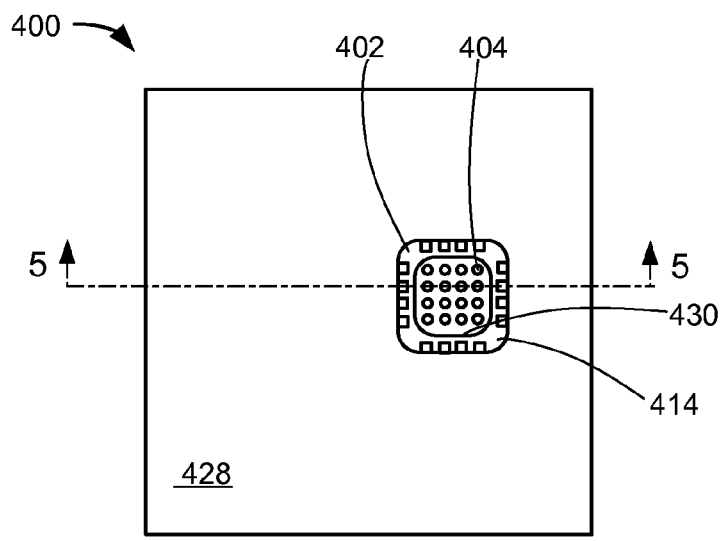
FIG. 4 is a top view of an integrated circuit package system in a third embodiment of the present invention.

Referring now to FIG. 4, therein is shown a top view of an integrated circuit package system 400 in a third embodiment of the present invention. The top view depicts contact pads 404 of a device structure 402 exposed in a recess 430 formed by an anti-flash structure 414. A package encapsulation 428 is adjacent to the anti-flash structure 414.

Figure 5:
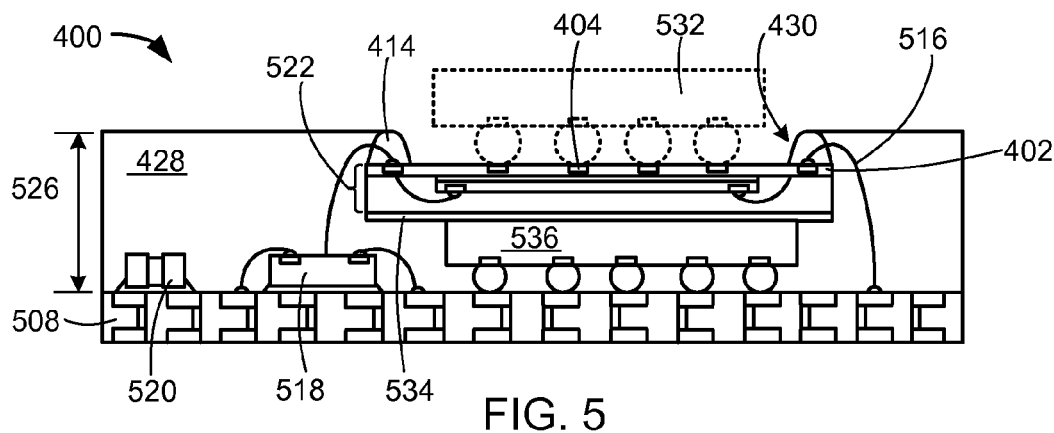
FIG. 5 is a cross-sectional view of the integrated circuit package system along line 5-5 of FIG. 4.

Referring now to FIG. 5, therein is shown a cross-sectional view of the integrated circuit package system 400 along line 5-5 of FIG. 4. The cross-sectional view depicts passive devices 520 and first integrated circuit devices 518, such as integrated circuit dice, mounted over a carrier 508. A second integrated circuit device 522, such as a packaged integrated circuit, mounts over a third integrated circuit device 536, such as a flip chip, with an adhesive 534, wherein the third integrated circuit device 536 mounts over the carrier 508. The third integrated circuit device 536 may be adjacent to one of the first integrated circuit devices 518. The second integrated circuit device 522 may overhang the one of the first integrated circuit devices 518.

The second integrated circuit device 522 includes the device structure 402 as its substrate. The second integrated circuit device 522 is shown in an offset location over the carrier 508 and not in a central location over the carrier 508. Electrical interconnects 516 may connect the device structure 402 and the carrier 508. As an example, the second integrated circuit device 522 is shown in an inverted configuration with the device structure 402 facing away from the carrier 508.

The anti-flash structure 414 is over the peripheral region of the device structure 402 and a portion of the electrical interconnects 516 over the device structure 402. The anti-flash structure 414, the second integrated circuit device 522, and the third integrated circuit device 536 may determine an encapsulation height 526 of the package encapsulation 428 over the carrier 508.

The package encapsulation 428 is over the carrier 508 covering the first integrated circuit devices 518, the passive devices 520, the second integrated circuit device 522, the third integrated circuit device 536, and the electrical interconnects 516. The package encapsulation 428 may be adjacent to the anti-flash structure 414 forming the recess 430 which exposes the contact pads 404 of the device structure 402.

A mounting device 532, such as an integrated circuit or a passive component, may optionally mount over the integrated circuit package system 400 forming an integrated circuit package-on-package system. The mounting device 532 is depicted with dotted lines. The mounting device 532 may mount over the device structure 402 and within the recess 430.

Figure 6:
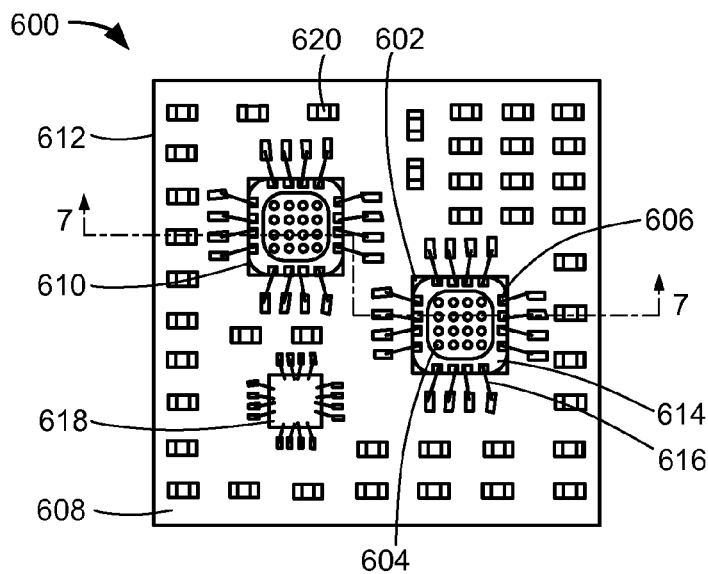
FIG. 6 is a top plan view of an integrated circuit package system in a fourth embodiment of the present invention.

Referring now to FIG. 6, therein is shown a top plan view of an integrated circuit package system 600 in a fourth embodiment of the present invention. The top plan view depicts the integrated circuit package system 600 without a cover. The top plan view depicts device structures 602, such as substrate, over a carrier 608, such as a substrate, with each of the device structures 602 having contact pads 604 and bond pads 606. Sides 610 of each of the device structures 602 are shown parallel to edges 612 of the carrier 608. Each of the device structures 602 is shown in an offset location over the carrier 608 and not in a central location over the carrier 608.

For illustrative purposes, the device structures 602 are shown as the same with each other, although it is understood that the device structures 602 may differ from one another. For example, the device structures 602 may differ in size, shape, orientation, configuration of the contact pads 604, and configuration of the bond pads 606.

For each of the device structures 602, the contact pads 604 are shown within a ring of an anti-flash structure 614 over a peripheral region of the device structures 602. Electrical interconnects 616, such as bond wires or ribbon bond wires, may connect between the bond pads 606 and the carrier 608. The anti-flash structure 614 covers the ends of the electrical interconnects 616 connected at the device structures 602.

A first integrated circuit device 618, such as integrated circuit dice or packaged integrated circuit, and passive devices 620, such as discrete resistors or capacitors, mount over the carrier 608. For illustrative purposes, the passive devices 620 are shown as the same type of components, although it is understood that the passive devices 620 may be different from each other. For example, the passive devices 620 may include different resistors, capacitors, inductors, or a combination thereof.

Figure 7:
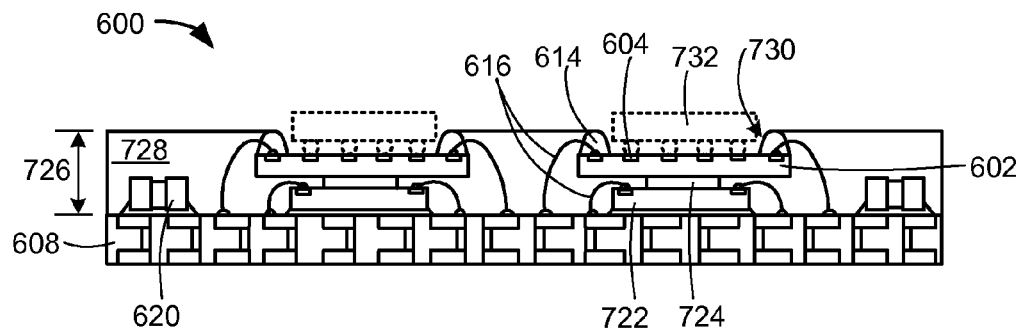
FIG. 7 is a cross-sectional view of the integrated circuit package system along line 7-7 of FIG. 6.

Referring now to FIG. 7, therein is shown a cross-sectional view of the integrated circuit package system 600 along line 7-7 of FIG. 6. The cross-sectional view depicts second integrated circuit devices 722, such as integrated circuit dice, mounted over the carrier 608. Spacers 724, such as a film adhesive, may provide clearance for the electrical interconnects 616 to connect between the second integrated circuit devices 722 and the carrier 608. For illustrative purposes, the second integrated circuit devices 722 are shown as the same type of devices, although it is understood that the second integrated circuit devices 722 may be different from each other, such as different types, functions, size, or technologies.

The device structures 602 mount over the second integrated circuit devices 722 and the carrier 608. The device structures 602 are shown in an offset location over the carrier 608 and not in a central location over the carrier 608. The anti-flash structure 614 over the peripheral region of the device structures 602, the device structures 602, the spacers 724, and the second integrated circuit devices 722 may determine an encapsulation height 726 of a package encapsulation 728 over the carrier 608.

The package encapsulation 728 is over the carrier 608 covering the first integrated circuit device 618 of FIG. 6, the passive devices 620, the second integrated circuit devices 722, the electrical interconnects 616, and the spacers 724. The package encapsulation 728 may be adjacent to the anti-flash structure 614 forming a recess 730 which exposes the contact pads 604 from each of the device structures 602.

The anti-flash structure 614 may serve a number of functions. For example, the anti-flash structure 614 mitigate or eliminate wire sweep of the electrical interconnects 616 connected with the device structures 602 thereby improving yield and lowering cost. As another example, the anti-flash structure 614 may mitigate or eliminate mold flashing over the contact pads 604 thereby improving reliability, improving yield, and lowering cost.

Mounting devices 732, such as integrated circuits or passive components, may optionally mount over the integrated circuit package system 600 forming an integrated circuit package-on-package system. The mounting devices 732 are depicted with dotted lines. The mounting devices 732 may mount over the device structures 602 and within the recess 730. For illustrative purposes, the mounting devices 732 are shown as the same type of devices, although it is understood that the mounting devices 732 may be different from each other, such as different types, functions, size, or technologies.

Figure 8:
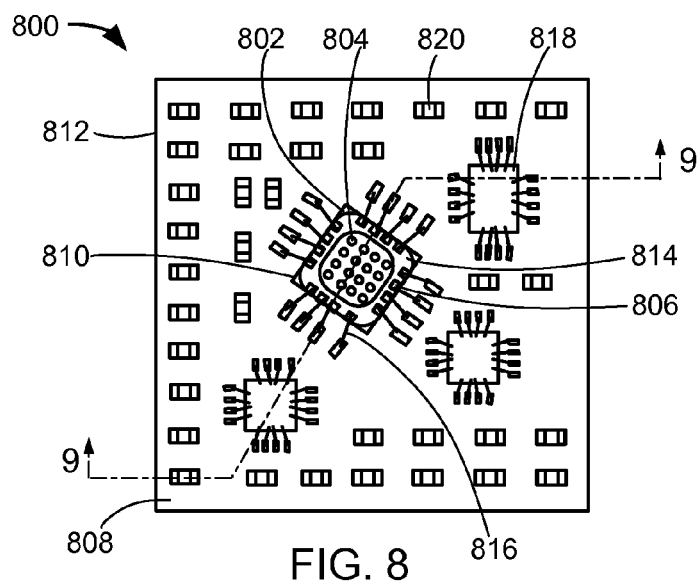
FIG. 8 is a top plan view of an integrated circuit package system in a fifth embodiment of the present invention.

Referring now to FIG. 8, therein is shown a top plan view of an integrated circuit package system 800 in a fifth embodiment of the present invention. The top plan view depicts the integrated circuit package system 800 without a cover. The top plan view depicts a device structure 802, such as substrate, having contact pads 804 and bond pads 806 over a carrier 808, such as a substrate. Sides 810 of the device structure 802 are shown not parallel to edges 812 of the carrier 808. The device structure 802 is shown in an offset location over the carrier 808 and not in a central location over the carrier 808.

The contact pads 804 are shown within a ring of an anti-flash structure 814 over a peripheral region of the device structure 802. Electrical interconnects 816, such as bond wires or ribbon bond wires, may connect between the bond pads 806 and the carrier 808. The anti-flash structure 814 covers the ends of the electrical interconnects 816 connected at the device structure 802.

First integrated circuit devices 818, such as integrated circuit dice or packaged integrated circuit, and passive devices 820, such as discrete resistors or capacitors, mount over the carrier 808. For illustrative purposes, some of the first integrated circuit devices 818 are shown as different with the others and others are the same, although it is understood that all of the first integrated circuit devices 818 may be different from each other or the same with each other. Also for illustrative purposes, the passive devices 820 are shown as the same type of components, although it is understood that the passive devices 820 may be different from each other. For example, the passive devices 820 may include different resistors, capacitors, inductors, or a combination thereof.

Figure 9:
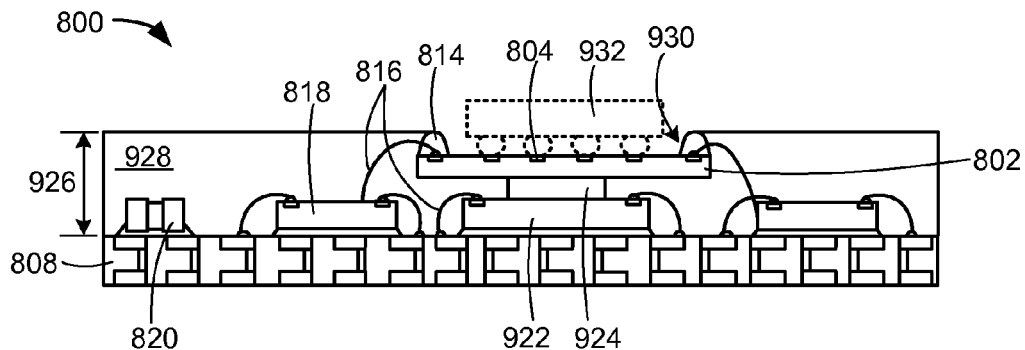
FIG. 9 is a cross-sectional view of the integrated circuit package system along line 9-9 of FIG. 8.

Referring now to FIG. 9, therein is shown a cross-sectional view of the integrated circuit package system 800 along line 9-9 of FIG. 8. The cross-sectional view depicts a second integrated circuit device 922, such as an integrated circuit die, mounted over the carrier 808. A spacer 924, such as a film adhesive, may provide clearance for the electrical interconnects 816 to connect between the second integrated circuit device 922 and the carrier 808.

The device structure 802 mounts over the second integrated circuit device 922 and the carrier 808. The device structure 802 is shown in an offset location over the carrier 808 and not in a central location over the carrier 808. The anti-flash structure 814 over the peripheral region of the device structure 802, the device structure 802, the spacer 924, and the second integrated circuit device 922 may determine an encapsulation height 926 of a package encapsulation 928 over the carrier 808.

The package encapsulation 928 is over the carrier 808 covering the first integrated circuit devices 818, the passive devices 820, the second integrated circuit device 922, the electrical interconnects 816, and the spacer 924. The package encapsulation 928 may be adjacent to the anti-flash structure 814 forming a recess 930 which exposes the contact pads 804 of the device structure 802.

The anti-flash structure 814 may serve a number of functions. For example, the anti-flash structure 814 mitigate or eliminate wire sweep of the electrical interconnects 816 connected with the device structure 802 thereby improving yield and lowering cost. As another example, the anti-flash structure 814 may mitigate or eliminate mold flashing over the contact pads 804 thereby improving reliability, improving yield, and lowering cost.

A mounting device 932, such as an integrated circuit or a passive component, may optionally mount over the integrated circuit package system 800 forming an integrated circuit package-on-package system. The mounting device 932 is depicted with dotted lines. The mounting device 932 may mount over the device structure 802 and within the recess 930.

Figure 10:
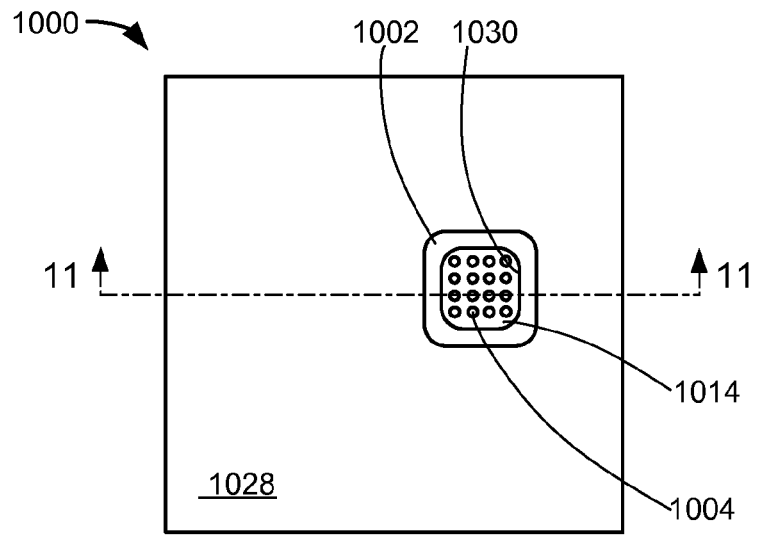
FIG. 10 is a top view of an integrated circuit package system in a sixth embodiment of the present invention.

Referring now to FIG. 10, therein is shown a top view of an integrated circuit package system 1000 in a sixth embodiment of the present invention. The top view depicts contact pads 1004 of a device structure 1002 exposed in a recess 1030 formed by an anti-flash structure 1014. A package encapsulation 1028 is adjacent to the anti-flash structure 1014.

Figure 11:
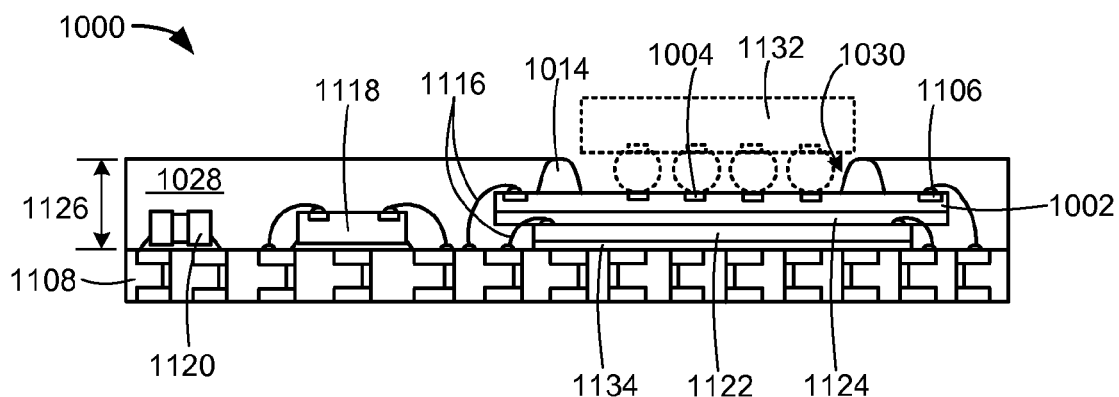
FIG. 11 is a cross-sectional view of the integrated circuit package system along line 11-11 of FIG. 10.

Referring now to FIG. 11, therein is shown a cross-sectional view of the integrated circuit package system 1000 along line 11-11 of FIG. 10. The cross-sectional view depicts a passive device 1120 and a first integrated circuit device 1118, such as integrated circuit die, mounted over a carrier 1108. A second integrated circuit device 1122, such as an integrated circuit die, mounts over the carrier 1108 with an adhesive 1134 and may be adjacent to the first integrated circuit device 1118.

A spacer 1124, such as a wire-in-film adhesive, may provide clearance for electrical interconnects 1116 to connect between the second integrated circuit device 1122 and the carrier 1108. Ends of the electrical interconnects 1116 connected to the second integrated circuit device 1122 are also in the spacer 1124.

The device structure 1002 mounts over the second integrated circuit device 1122 and the carrier 1108. The electrical interconnects 1116 connect bond pads 1106 of the device structure 1002 and the carrier 1108. The bond pads 1106 are at peripheral region of the device structure 1002. The device structure 1002 is shown in an offset location over the carrier 1108 and not in a central location over the carrier 1108. The anti-flash structure 1014 may be over a region of the device structure 1002 between the bond pads 1106 and the contact pads 1004. The anti-flash structure 1014 does not cover the electrical interconnects 1116 connected to the bond pads 1106. The anti-flash structure 1014, the device structure 1002, the spacer 1124, and the second integrated circuit device 1122 may determine an encapsulation height 1126 of the package encapsulation 1028 over the carrier 1108.

The package encapsulation 1028 is over the carrier 1108 covering the first integrated circuit device 1118, the passive devices 1120, the second integrated circuit device 1122, the electrical interconnects 1116, and the spacer 1124. The package encapsulation 1028 may be adjacent to the anti-flash structure 1014 forming the recess 1030 which exposes the contact pads 1004 of the device structure 1002. The anti-flash structure 1014 may serve a number of functions. For example, the anti-flash structure 1014 may mitigate or eliminate mold flashing over the contact pads 1004 thereby improving reliability, improving yield, and lowering cost.

A mounting device 1132, such as an integrated circuit or a passive component, may optionally mount over the integrated circuit package system 1000 forming an integrated circuit package-on-package system. The mounting device 1132 is depicted with dotted lines. The mounting device 1132 may mount over the device structure 1002 and within the recess 1030.

Figure 12:
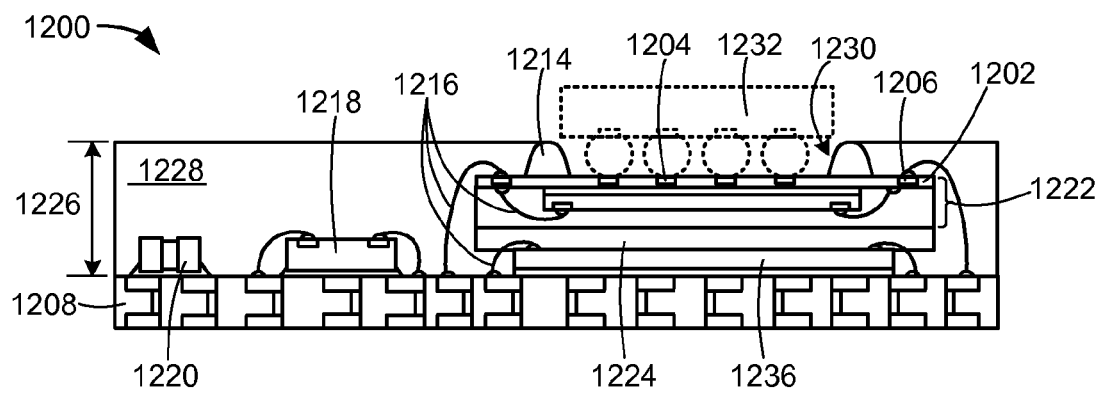
FIG. 12 is a cross-sectional view of an integrated circuit package system exemplified by the top view of FIG. 10 in a seventh embodiment of the present invention.

Referring now to FIG. 12, therein is shown a cross-sectional view of an integrated circuit package system 1200 exemplified by the top view of FIG. 10 in a seventh embodiment of the present invention. The cross-sectional view depicts a passive device 1220 and a first integrated circuit device 1218, such as integrated circuit die, mounted over a carrier 1208. A second integrated circuit device 1222, such as a packaged integrated circuit, mounts over a third integrated circuit device 1236, such as an integrated circuit die, with a spacer 1224, wherein the third integrated circuit device 1236 mounts over the carrier 1208. The third integrated circuit device 1236 may be adjacent to the first integrated circuit device 1218.

The second integrated circuit device 1222 includes a device structure 1202 as its substrate. The second integrated circuit device 1222 is shown in an offset location over the carrier 1208 and not in a central location over the carrier 1208. Electrical interconnects 1216 may connect bond pads 1206 of the device structure 1202 and the carrier 1208. As an example, the second integrated circuit device 1222 is shown in an inverted configuration with the device structure 1202 facing away from the carrier 1208.

The spacer 1224, such as a wire-in-film adhesive, may provide clearance for the electrical interconnects 1216 to connect between the second integrated circuit device 1222 and the third integrated circuit device 1236. Ends of the electrical interconnects 1216 connected to the third integrated circuit device 1236 are also in the spacer 1224.

The bond pads 1206 are at peripheral region of the device structure 1202. An anti-flash structure 1214 may be over a region of the device structure 1202 between the bond pads 1206 and contact pads 1204. The anti-flash structure 1214 does not cover the electrical interconnects 1216 connected to the bond pads 1206. The anti-flash structure 1214, the device structure 1202, the spacer 1224, and the second integrated circuit device 1222 may determine an encapsulation height 1226 of a package encapsulation 1228 over the carrier 1208.

The package encapsulation 1228 is over the carrier 1208 covering the first integrated circuit device 1218, the passive devices 1220, the second integrated circuit device 1222, the electrical interconnects 1216, the third integrated circuit device 1236, and the spacer 1224. The package encapsulation 1228 may be adjacent to the anti-flash structure 1214 forming a recess 1230 which exposes the contact pads 1204 of the device structure 1202. The anti-flash structure 1214 may serve a number of functions. For example, the anti-flash structure 1214 may mitigate or eliminate mold flashing over the contact pads 1204 thereby improving reliability, improving yield, and lowering cost.

A mounting device 1232, such as an integrated circuit or a passive component, may optionally mount over the integrated circuit package system 1200 forming an integrated circuit package-on-package system. The mounting device 1232 is depicted with dotted lines. The mounting device 1232 may mount over the device structure 1202 and within the recess 1230.

Figure 13:
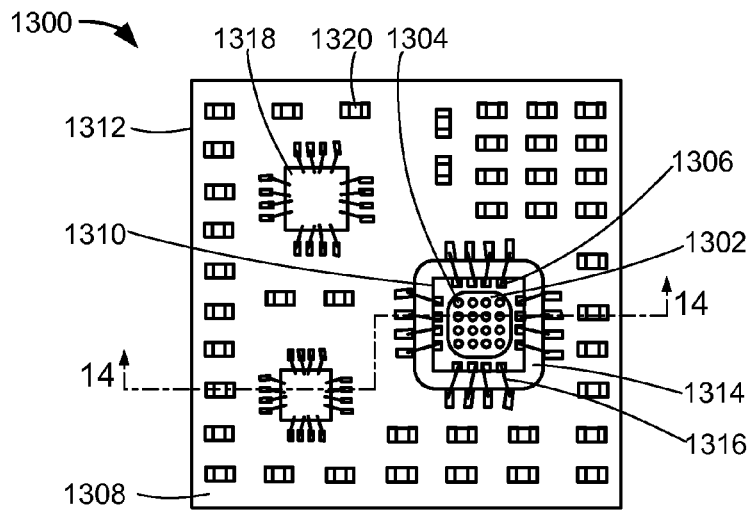
FIG. 13 is a top plan view of an integrated circuit package system in an eighth embodiment of the present invention.

Referring now to FIG. 13, therein is shown a top plan view of an integrated circuit package system 1300 in an eighth embodiment of the present invention. The top plan view depicts the integrated circuit package system 1300 without a cover. The top plan view depicts passive devices 1320 and first integrated circuit devices 1318, such as wire bonded integrated circuit die, mounted over a carrier 1308. For illustrative purposes, the first integrated circuit devices 1318 are shown with different sizes from each other, although it is understood that the first integrated circuit devices 1318 may be the same type of devices.

The top plan view also depicts a device structure 1302, such as an integrated circuit die, having contact pads 1304 and bond pads 1306 over the carrier 1308, such as a substrate. Sides 1310 of the device structure 1302 are shown parallel to edges 1312 of the carrier 1308. The device structure 1302 is shown in an offset location over the carrier 1308 and not in a central location over the carrier 1308.

The contact pads 1304 are shown within a ring of an anti-flash structure 1314 over a peripheral region of the device structure 1302. Electrical interconnects 1316, such as bond wires or ribbon bond wires, may connect between the bond pads 1306 and the carrier 1308. The anti-flash structure 1314 covers ends of the electrical interconnects 1316 connected at the device structure 1302 and overflows from the device structure 1302 to the carrier 1308.

Figure 14:
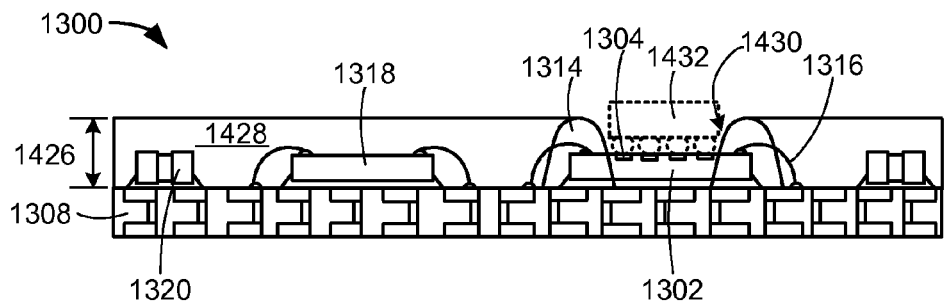
FIG. 14 is a cross-sectional view of the integrated circuit package system along line 14-14 of FIG. 13.

Referring now to FIG. 14, therein is shown a cross-sectional view of the integrated circuit package system 1300 along line 14-14 of FIG. 13. The cross-sectional view depicts the device structure 1302 mounted over the carrier 1308. The electrical interconnects 1316 connect between the device structure 1302 and the carrier 1308. The device structure 1302 is shown in an offset location over the carrier 1308 and not in a central location over the carrier 1308. The anti-flash structure 1314 is over the peripheral region of the device structure 1302 and overflowed to a portion of the carrier 1308 adjacent to the device structure 1302. The anti-flash structure 1314, electrical interconnects 1316, and the electrical interconnects 1316 may determine an encapsulation height 1426 of a package encapsulation 1428 over the carrier 1308.

The package encapsulation 1428 is over the carrier 1308 covering the first integrated circuit devices 1318, the passive devices 1320, the device structure 1302, the electrical interconnects 1316. The package encapsulation 1428 may be adjacent to the anti-flash structure 1314 forming a recess 1430 which exposes the contact pads 1304 of the device structure 1302.

The anti-flash structure 1314 may serve a number of functions. For example, the anti-flash structure 1314 mitigate or eliminate wire sweep of the electrical interconnects 1316 connected with the device structure 1302 thereby improving yield and lowering cost. As another example, the anti-flash structure 1314 may mitigate or eliminate mold flashing over the contact pads 1304 thereby improving reliability, improving yield, and lowering cost.

A mounting device 1432, such as an integrated circuit or a passive component, may optionally mount over the integrated circuit package system 1300 forming an integrated circuit package-on-package system. The mounting device 1432 is depicted with dotted lines. The mounting device 1432 may mount over the device structure 1302 and within the recess 1430.

Figure 15:
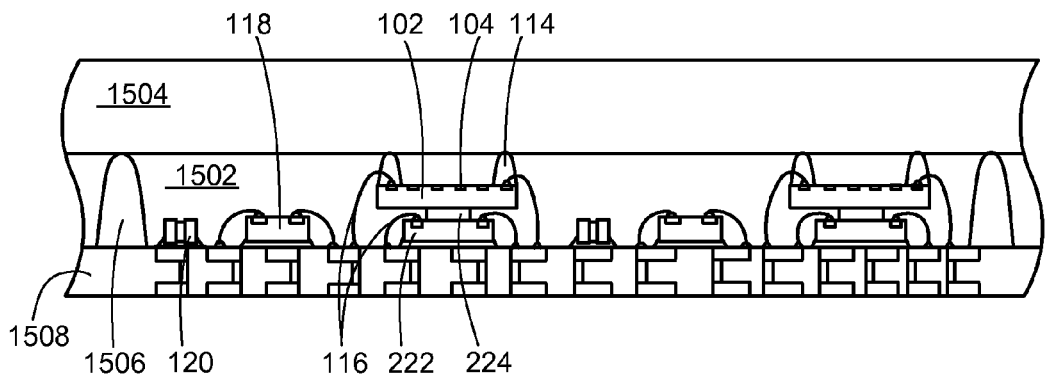
FIG. 15 is a cross-sectional view of the integrated circuit package system of FIG. 2 in a step forming an encapsulation.

Referring now to FIG. 15, therein is shown a cross-sectional view of the integrated circuit package system 100 of FIG. 2 in a step forming an encapsulation 1502. A planar mold chase 1504 may be pressed on the anti-flash structure 114. The planar mold chase 1504 may also be pressed on a mold stop 1506, such as a stop of non-conductive epoxy, sealant, polymeric material, wire lock resin material, or penetrable film adhesive. The anti-flash structure 114, the mold stop 1506, or a combination thereof may cushion the force from the planar mold chase 1504 preventing damage to the device structure 102. The anti-flash structure 114 and the mold stop 1506 include resilient property compensating for coplanarity errors due to tilting in the assembly process of the integrated circuit package system 100.

The encapsulation 1502 is formed over a carrier strip 1508 covering the first integrated circuit devices 118, the passive devices 120, the spacer 224, and the second integrated circuit device 222. The anti-flash structure 114 mitigates or eliminates mold flashing over the contact pads 104 of the device structure 102. The encapsulated structure may be singulated forming the integrated circuit package system 100.

As another example, the planar mold chase 1504 may be optional. The mold stop 1506 may function as a dam in a molding process, such as a dam-and-fill method, where liquid encapsulation process may applied over the carrier strip 1508 covering the first integrated circuit devices 118, the passive devices 120, the spacer 224, and the second integrated circuit device 222. The anti-flash structure 114 may also function as a dam in the molding process exposing the contact pads 104 of the device structure 102.

It has been discovered that the present invention improves yield and lower cost by the offset location of the device structure with the anti-flash structure. The offset location and angle may be varied to distribute molding compound flow such that the passive devices or the other integrated circuits mounted on the carrier will not inadvertently short, such as from wire sweeping, will not lift devices causing connection breakage, or create voids in the encapsulation. This distribution of flow pressure may also permit high flow, high pressure molding process to improve throughput, increasing productivity, and increasing profitability.

Figure 16:
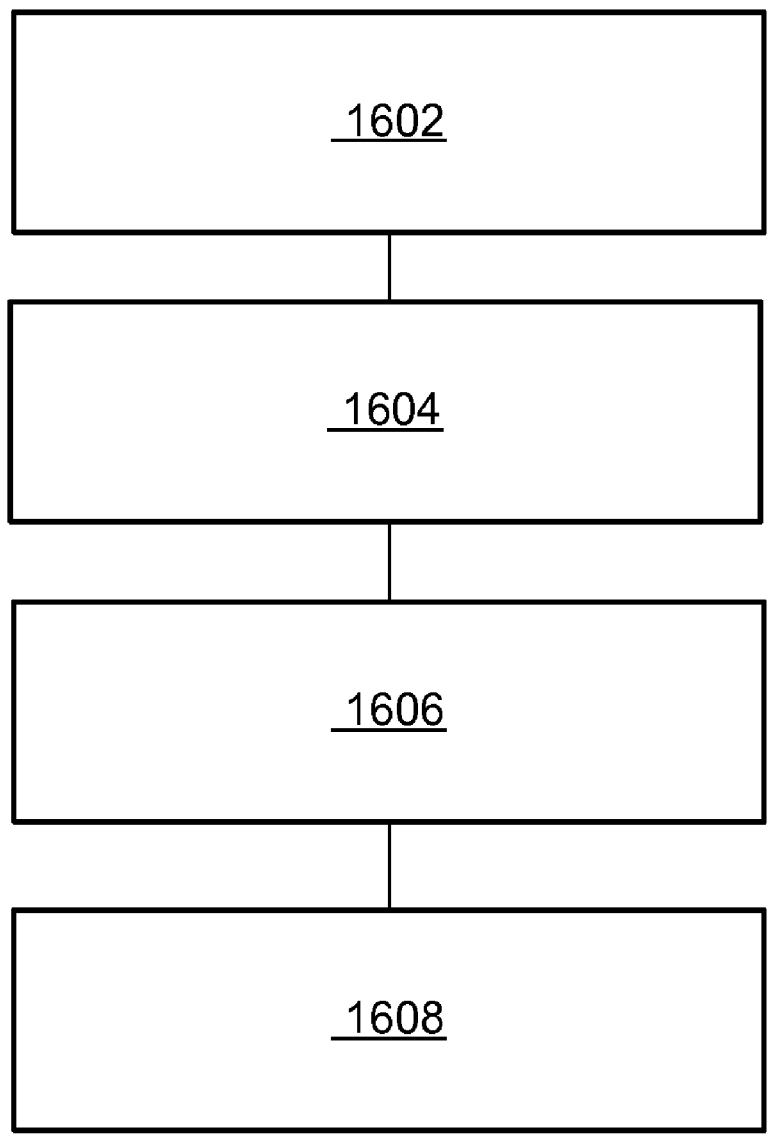
FIG. 16 is a flow chart of an integrated circuit package system for manufacturing of the integrated circuit package system in an embodiment of the present invention.

Referring now to FIG. 16, therein is shown a flow chart of an integrated circuit package system 1600 for manufacturing the integrated circuit package system 1600 in an embodiment of the present invention. The system 1600 includes mounting a device structure in an offset location over a carrier with the device structure having a bond pad and a contact pad in a block 1602; connecting an electrical interconnect between bond pad and the carrier in a block 1604; forming an anti-flash structure over the device structure with anti-flash structure exposing the contact pad in a block 1606; and forming a package encapsulation adjacent to the anti-flash structure and over the carrier in a block 1608.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   a carrier;
   a device structure in an offset location over the carrier with the device structure having a bond pad and a contact pad;
   an electrical interconnect between the bond pad and the carrier;
   an anti-flash structure over the device structure with the anti-flash structure exposing the contact pad, a portion of the electrical interconnect in contact and conformally enclosed by the anti-flash structure; and
   a package encapsulation adjacent to the anti-flash structure and over the carrier.

2. The system as claimed in claim 1 wherein the device structure is an interposer.

3. The system as claimed in claim 1 wherein the device structure is an integrated circuit device.

4. The system as claimed in claim 1 wherein the anti-flash structure over the device structure includes the anti-flash structure over a portion of the electrical interconnect over the bond pad.

5. The system as claimed in claim 1 further comprising a first integrated circuit device over the carrier.

6. The system as claimed in claim 1 further comprising:
an integrated circuit device over the carrier;
a passive device over the carrier; and
wherein the anti-flash structure is on the device structure.

7. The system as claimed in claim 6 further comprising:
an integrated circuit die over the carrier; and
wherein the device structure over the carrier includes:
the device structure over the integrated circuit die.

8. The system as claimed in claim 6 wherein the anti-flash structure includes the anti-flash structure over a side of the device structure onto the carrier.

9. The system as claimed in claim 6 wherein the device structure in the offset location over the carrier includes the device structure with a side of the device structure not parallel to an edge of the carrier.

10. The system as claimed in claim 6 further comprising a mounting device over the device structure within the anti-flash structure.

* * * * *